(12) United States Patent
Cao

(10) Patent No.: US 7,929,293 B2
(45) Date of Patent: Apr. 19, 2011

(54) HEAT DISSIPATING ASSEMBLY

(75) Inventor: Liang-Liang Cao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 85 days.

(21) Appl. No.: 12/479,967

(22) Filed: Jun. 8, 2009

(65) Prior Publication Data
US 2010/0284142 A1 Nov. 11, 2010

(51) Int. Cl.
*H05K 7/20* (2006.01)
(52) U.S. Cl. ............ 361/679.47; 361/704; 361/697; 361/709; 361/710; 165/80.3; 165/185
(58) Field of Classification Search .......... 361/679.46–679.54, 690–697, 361/700–712, 715–724; 165/80.3–80.5, 165/121–126, 104.33, 104.34, 185; 257/706–727; 62/259.2; 174/16.3, 252; 454/184
See application file for complete search history.

(56) References Cited

U.S. PATENT DOCUMENTS

| | | | | |
|---|---|---|---|---|
| 6,308,771 | B1 * | 10/2001 | Tavassoli | 165/80.3 |
| 6,418,020 | B1 * | 7/2002 | Lin | 361/703 |
| 6,505,680 | B1 * | 1/2003 | Hegde | 165/80.3 |
| 6,657,865 | B1 * | 12/2003 | Tseng et al. | 361/709 |
| 6,675,885 | B2 * | 1/2004 | Kuo | 165/185 |
| 6,779,593 | B1 * | 8/2004 | Hegde | 165/80.3 |
| 7,164,582 | B2 * | 1/2007 | Hegde | 361/697 |
| 7,408,777 | B2 * | 8/2008 | Jeong | 361/704 |
| 7,753,106 | B2 * | 7/2010 | Lin et al. | 165/80.3 |
| 2003/0209342 | A1 * | 11/2003 | Hsin et al. | 165/80.3 |
| 2006/0139887 | A1 * | 6/2006 | Kameda | 361/704 |
| 2007/0084595 | A1 * | 4/2007 | Lin et al. | 165/185 |
| 2010/0046168 | A1 * | 2/2010 | Liaw | 361/704 |

FOREIGN PATENT DOCUMENTS

JP 406021283 A * 1/1994

* cited by examiner

*Primary Examiner* — Michael V Datskovskiy
(74) *Attorney, Agent, or Firm* — D. Austin Bonderer

(57) ABSTRACT

A heat dissipating assembly includes a heat generating component, a heat sink, and a fan. The heat sink includes a base attached on the heat generating component and a plurality of fins attached on the base. The fan is attached to a top surface of the fins. The top surface of the fins is wider than the base. The fins incline inwardly from the top surface to the base for gathering cooling air from the fan to the base.

11 Claims, 3 Drawing Sheets

HEAT DISSIPATING ASSEMBLY

BACKGROUND

1. Technical Field

The present disclosure relates to heat dissipating assemblies, and particularly relates to a heat dissipating assembly for removing heat from an electronic component.

2. Description of Related Art

A typical heat dissipating assembly usually includes a heat sink attached on a heat generating component, such as a CPU chip, and a fan attached to the heat sink. The heat sink includes a heat-conductive base attached on the heat generating component and a plurality of fins attached on the base. The fan is attached on the top of the fins to feed cooling air to the heat generating component. The heat generating component is usually attached to a central portion of an underside of the heat-conductive base. Thus, a temperature of the central portion of the heat-conductive base is higher than any other portions of the heat sink. However, the cooling air from the fan cannot be effectively directed toward the central portion of the base. It's inefficient to dissipate heat from the heat generating component.

Therefore, an improved heat dissipating assembly is desired.

DETAILED DESCRIPTION OF THE EMBODIMENTS

Figure 1:
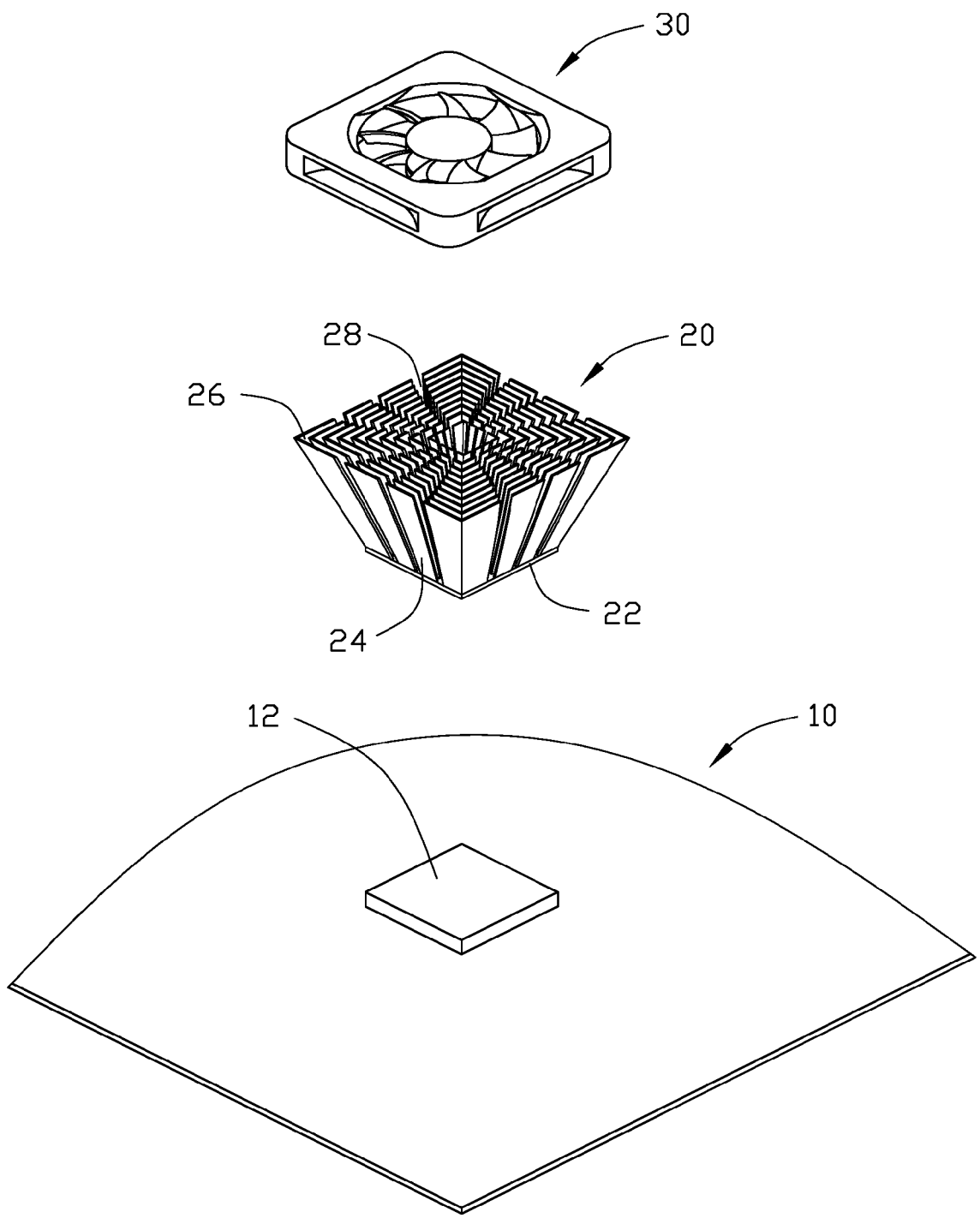
FIG. 1 is an exploded, isometric view of an embodiment of a heat dissipating assembly.
Figure 2:
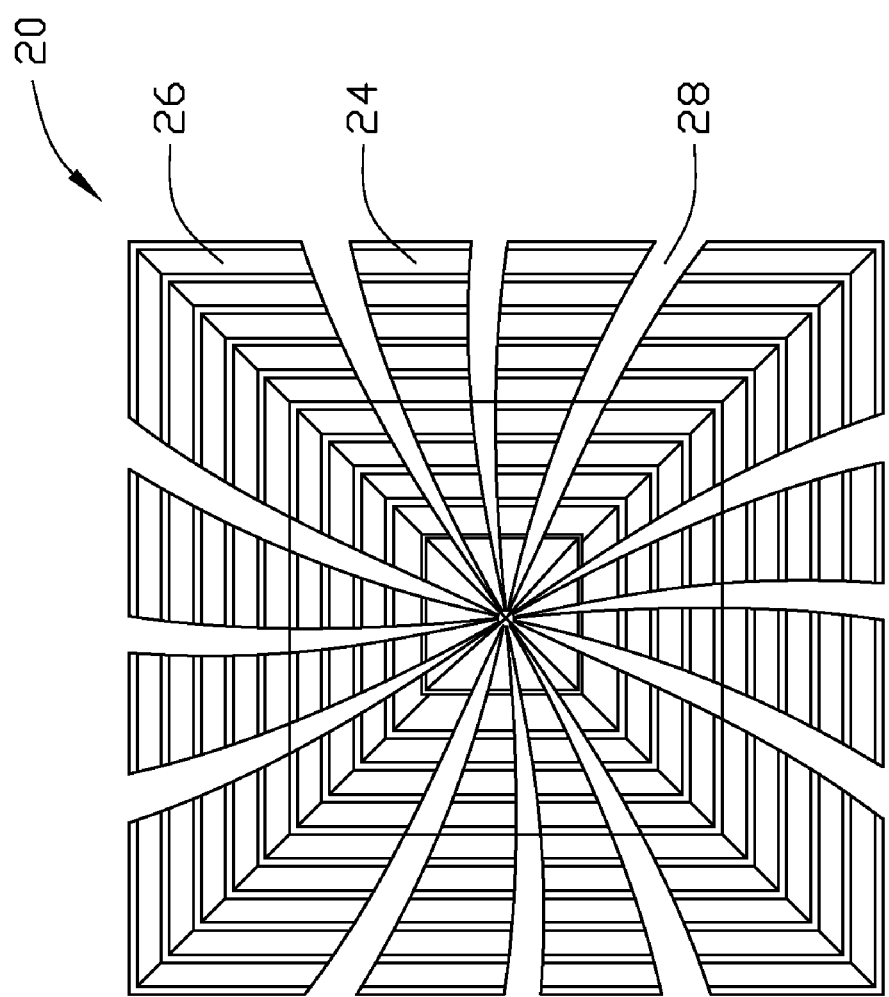
FIG. 2 is a plan view of a top of the heat sink of FIG. 1.

Referring to FIGS. 1 and 2, an embodiment of a heat dissipating assembly includes a circuit board 10 with a heat generating component 12 mounted thereon, a heat sink 20, and a fan 30. The heat sink 20 and the fan 30 are utilized to dissipate heat from the heat generating component 12. In the embodiment, the circuit board 10 is a motherboard, and the heat generating component 12 is a CPU (Central Processing Unit).

The heat sink 20 includes a base 22 and groups of fins 24, 26 attached on the base 22. The heat sink 20 becomes narrower from a top surface thereof to the base 22. The bottom surface of the base 22 is the same shape and size as the top surface of the heat generating component 12. The top surface of the heat sink 20 is the same size and shape as the bottom surface of the fan 30. Each of four sides of the heat sink 20 has two groups of fins 24. Each of four corners of the heat sink 20 has one group of fins 26. The groups of fins 24 are made from a plurality of flat metal sheets. The metal sheets of each group of fins 24 or 26 are parallel to each other and become smaller from an outside to an inside of the heat sink 20. A groove 28 is defined between each of two adjacent groups of fins 24 (or 24 and 26). The fins 24, 26 and the grooves 28 are formed regularly around a central axis line of the heat sink 20. The fins 24, 26 incline downwardly and inwardly from the top to the base 22 of the heat sink 20 for gathering cooling air from the fan 30 to the base 22.

Figure 3:
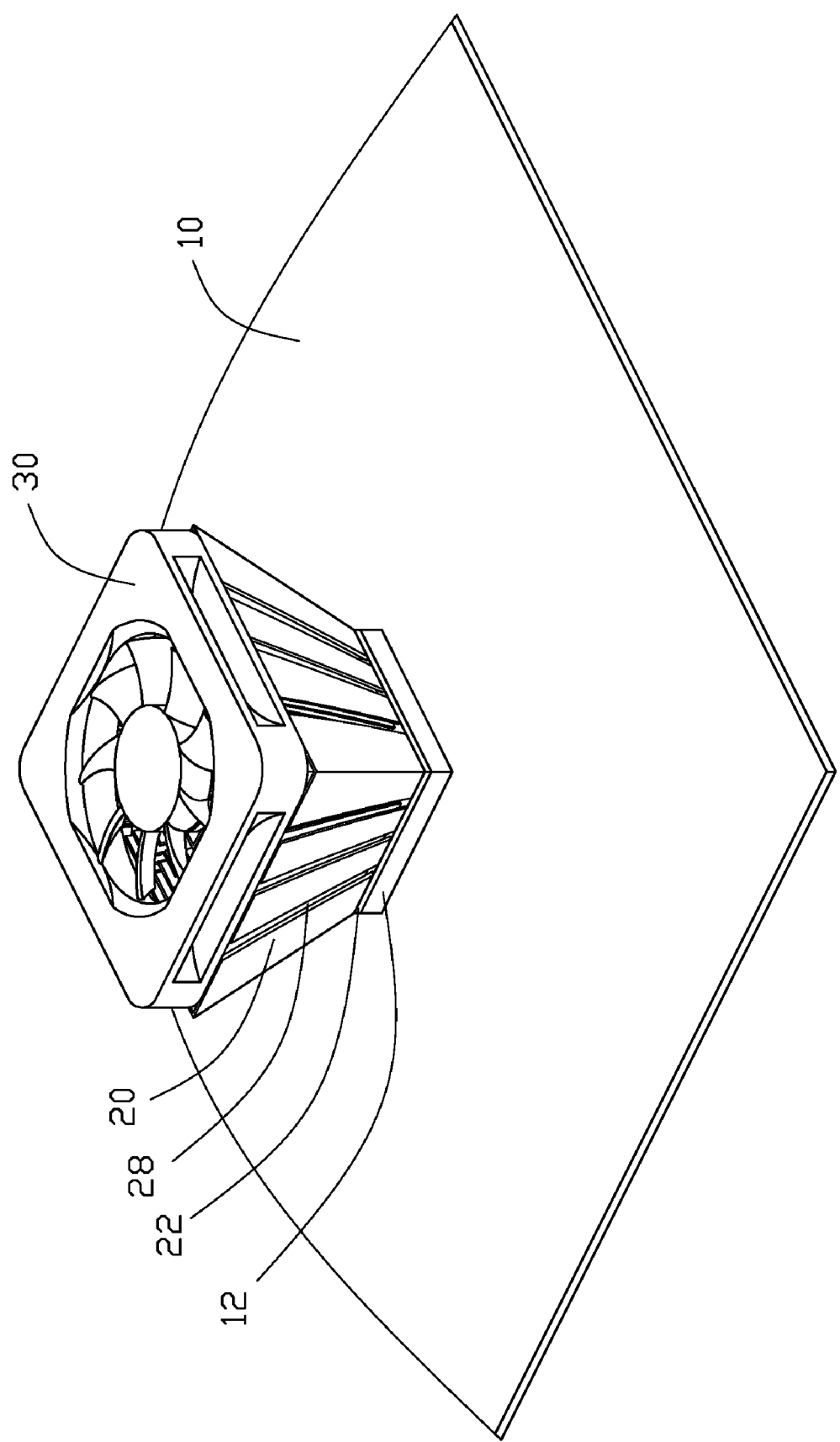
FIG. 3 is an assembled isometric view of FIG. 1.

Referring to FIG. 3, the base 22 is attached on and in contact with the heat generating component 12 of the circuit board 10. The fan 30 is attached to the top of the heat sink 20 and feeds cooling air to the heat sink 20. The fins 24, 26 and the grooves 28 of the heat sink 20 guide the cooling air from the top of the heat sink 20 to the base 22. The cooling air comes together at the base 22. In this manner, it's efficient to remove heat from the heat generating component 12, thereby ensuring the heat generating component 12 works in a safe temperature range.

While the present disclosure has illustrated by the description preferred embodiments, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present invention is not limited to the specific details and illustrative examples shown and described.

The invention claimed is:

1. A heat dissipating device comprises:
   a base for contacting with a heat generating component; and
   a plurality of fins attached on the base;
   wherein the fins incline downwardly and inwardly from a top thereof to the base, and the fins at four corners of the heat dissipating device are parallel to each other and become smaller from an outside to an inside of the heat dissipating device.

2. The heat dissipating device of claim 1, wherein the fins define a plurality of grooves, the grooves is regularly formed around a central axis line of the heat sink device.

3. The heat dissipating device of claim 1, wherein the fins at four sides of the heat dissipating device are parallel to each other and become smaller from an outside to an inside of the heat dissipating device.

4. The heat dissipating device of claim 1, wherein a top of the heat dissipating device is wider than the base.

5. The heat dissipating device of claim 4, wherein the heat dissipating device becomes narrower from the top to the base gradually.

6. An assembly comprising:
   a heat generating component;
   a heat sink comprising a base attached on the heat generating component and a plurality of fins attached on the base, the heat sink having four corners and four sides;
   a fan attached to a top surface of the fins;
   wherein the top surface of the fins is wider than the base, the fins incline inwardly from the top surface to the base for gathering cooling air from the fan to the base; the fins comprise four groups of fins at the four corners of the heat sink, and at least one group of fins at each of the four sides of the heat sink, the four groups of fins at the four corners of the heat sink are bent sheets, and the at least one group of fins at each of the four sides of the heat sink are flat sheets.

7. The assembly of claim 6, wherein the base has the same size as the top surface of the heat generating component.

8. The assembly of claim 7, wherein the top surface of the fins is sized same as the fan.

9. The assembly of claim 6, wherein each of the four groups of fins at the four corners of the heat sink are parallel to each other and become smaller from an outside to an inside of the heat sink.

10. The assembly of claim 6, wherein the at least one group of fins at each of the four sides of the heat sink are parallel to each other and become smaller from an outside to an inside of the heat sink.

11. The assembly of claim 6, wherein the heat sink becomes narrower from the top surface to the base gradually.

* * * * *